July 21, 1964 B. G. BENDER ET AL 3,141,226

SEMICONDUCTOR ELECTRODE ATTACHMENT

Filed Sept. 27, 1961 2 Sheets-Sheet 1

INVENTORS.
BOB G. BENDER,
LEONARD BERNSTEIN,
BY
Charles S. Haughey
ATTORNEY.

SEMICONDUCTOR ELECTRODE ATTACHMENT

Filed Sept. 27, 1961 2 Sheets-Sheet 2

INVENTORS.
BOB G. BENDER,
LEONARD BERNSTEIN,
BY Charles S. Haughey
ATTORNEY.

United States Patent Office 3,141,226
Patented July 21, 1964

3,141,226
SEMICONDUCTOR ELECTRODE ATTACHMENT

Bob G. Bender, Garden Grove, Calif., and Leonard Bernstein, New York, N.Y., assignors to Hughes Aircraft Company, Culver City, Calif., a corporation of Delaware Filed Sept. 27, 1961, Ser. No. 141,096
8 Claims. (Cl. 29—25.3)

This invention relates to attachment of electrodes to semiconductor elements. It is particularly useful in utilizing gold in a bond, which is made at temperatures below the melting point of gold, so that the gold device leads previously attached are not disturbed; and is also particularly useful in bonding electrodes to materials which are normally difficult to wet, hence to alloy too.

Semiconductor crystal devices, such as silicon alloy junction transistors and diodes, require high purity materials and processing to avoid undesirable contamination, and should withstand relatively high storage and operating temperatures. This requires corrosion resistance, high bond strength, adequate wetting during the bonding process and freezing with a minimum of adverse shrinkage effects. Dewetting, particularly of the electrode, should be avoided during the bonding operation. Plating processes may often be used for depositing alloy bonding materials provided that vacuum, high temperature purification may then be applied. Such purification temperatures are generally well in excess of what a partially fabricated semiconductor crystal can tolerate, and alloy materials deposited by plating contain an excess quantity of impurity materials for subsequent semiconductor device fabrication, handling or encapsulation.

Aluminum alloy junction silicon diode semiconductor devices are adequately stable in their properties in storage and operation at 200° C. provided they are properly encapsulated, and their properties may be enhanced if thin crystals and large area base electrode attachments are used. The use of gold as a bonding alloy requires excessively high bonding temperatures, and dissolves so much silicon that relatively heavy, thick crystals of silicon must be used. Further, aluminum, and aluminum-rich alloys such as aluminum silicon are generally very difficult to wet, hence difficult to bond to.

Attempts to alloy various metals with gold to form a bonding alloy have generally resulted in bonds which are not reliable and stable at 200° C. Gold-tin alloys have met partial success, particularly with silicon device crystals, but gold-tin forms a very brittle alloy which is difficult to work with or fabricate, and in bonding it dewets many metals, and its very high shrinkage during cooling causes cooling stresses during bonding, which often breaks the crystal. An alloy of AuSn, about 80% gold by weight is highly resistant to etchants used for cleaning semiconductor elements, and has a high affinity for silicon, germanium, aluminum and other difficult to wet metals, but it does not dissolve excessive quantities of such metals at suitably low bonding temperatures. Thus a bonding alloy of AuSn seems desirable in some respects, but is very difficult to work with and highly unsatisfactory in other respects.

This invention provides a unique solution to these problems and requirements, and will be explained in connection with the production of very small silicon diodes in sealed packages where the advantages thereof are particularly evident. For consideration of what is believed to be novel and our invention, attention is directed to the following specification and the accompanying claims and drawings in which:

Figure 1:
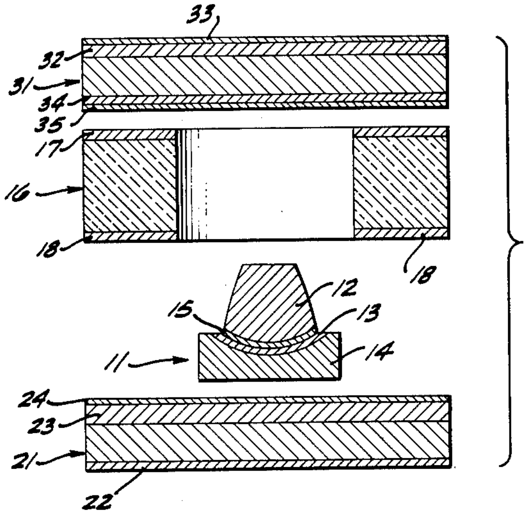
FIG. 1 is a cross-sectional exploded view of a silicon diode assembly before the final sealing operation.
Figure 2:
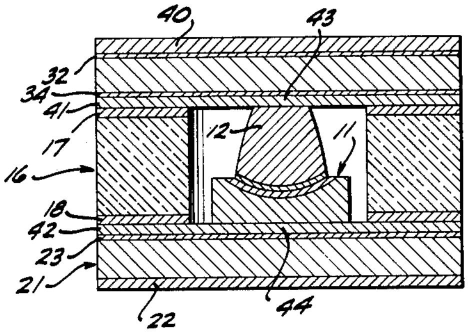
FIG. 2 is a cross-sectional view of the assembly of FIG. 1 after the final sealing operation.

The exploded view of a diode assembly in FIG. 1 shows a partially fabricated device crystal element 11 with an aluminum bit 12 alloyed to it to form a conventional aluminum-silicon alloy junction between regrown P-type, aluminum doped material 13 and the N-type, usually arsenic or phosphorus doped, base crystal portion 14. An ohmic contact such as antimony-doped gold, not shown, may be preformed on the surface opposite the aluminum bit 12, but is not generally desired. An aluminum-silicon alloy 15 is formed between the bit 12 and the aluminum doped material 13. A ceramic ring 16, which may be of 85 to 96% alumina plus $SiO_2$ and minor oxide constituents, has metallized and plated electrically conductive ends 17 and 18 to which a metal bond may be made to produce a hermetic seal. A metallized coating of molybdenum and manganese in a weight ratio of 2 to 1 may be formed by painting a suspension of powders thereof in isobutyl methacrylate thinned with 20% butyl carbitol acetate on to preselected areas of the ceramic to be coated. The painted ceramic may then be fired in hydrogen atmosphere at about 1450° C. for 30 minutes, cooled, and then cleansed in an alkaline rinse.

The metallized surface so formed is difficult to solder or bond to, and the surface is accordingly plated with material to which a suitable solder bond may be made, such as nickel or gold, as by well known electroless plating processes.

A lower, or base, electrode 21 is preferably formed of an iron-nickel-cobalt paramagnetic alloy whose thermal expansion characteristics sufficiently match silicon for reliable bonds. An alloy marketed under the trade names of "Kovar" or "Fernico," of about 54% iron, 29% nickel and 17% cobalt, may be used. The base electrode 21 is coated on one side with a gold layer 22 for corrosion resistance and for color identification, and on the other side with successive layers 23 and 24 of gold and tin, respectively. The proportions of tin and gold in layers 23 and 24 are very important, and are chosen to provide enough tin to lower the melting point of the gold surface from about 1063° C. to a useful bonding temperature, preferably between 309° C. and 410° C. (for reasons to appear) and provide wetting of the silicon, but must not have so much tin that it will dissolve completely through the gold layer. Tin, by itself, provides very poor wetting to silicon, and will not satisfactorily bond thereto. A proper thickness of tin on gold will first melt the tin at its melting point of about 232° C. As shown in the gold-tin constitutional diagram of FIG. 5, which is taken from Constitution of Binary Alloys, by Hansen, published by McGraw-Hill Book Company, Second Edition, 1959, page 233, as the temperature rises to 252° C. the tin dissolves the adjacent gold surface and forms $AuSn_4$ compound; and as the temperature rises further to 309° C. the tin dissolves additional gold and forms an $AuSn_2$ compound which, if allowed to remain and freeze would be very brittle. After sufficient time above 309° C., which may be a temperature up to about 450° C., the tin further dissolves the gold to form AuSn. The maximum temperature is low enough to insure a remainder of undissolved gold. Upon cooling, the gold-tin alloy will freeze at 280° C., higher than the initial melting temperature, and an excess of gold remains, undissolved, on the surface of the electrode 21.

Figure 3:
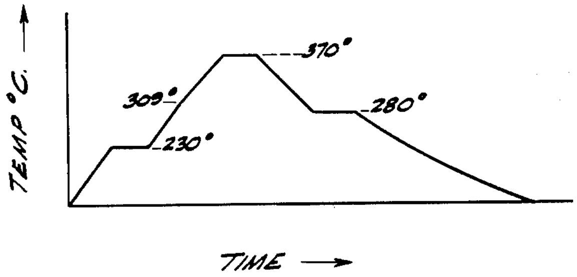
FIG. 3 is a schematic time-temperature chart illustrating phase changes during the final sealing operation.
Figure 5:
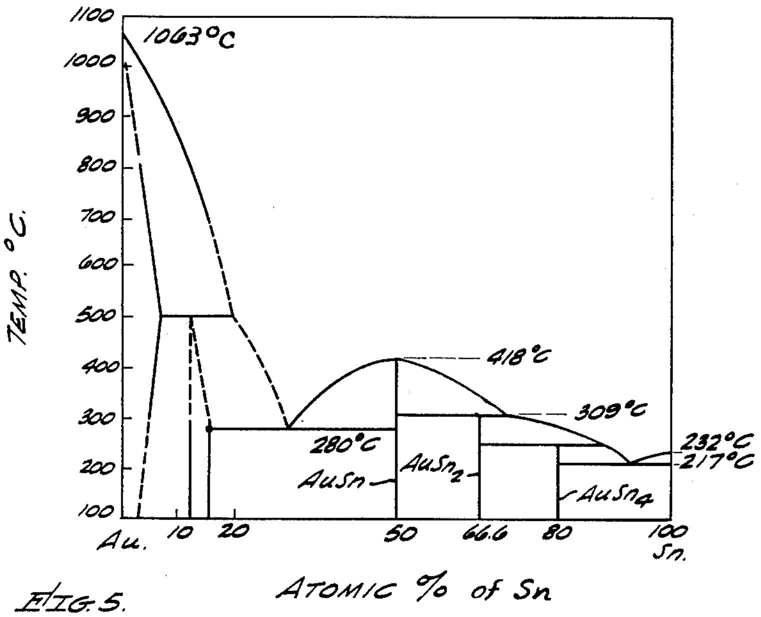
FIG. 5 is a portion of a binary constitution diagram for the system gold-tin.

As illustrated in the time-temperature chart of FIG. 3, upon heating an element coated with tin on an excess of gold, the tin initially melts at 232° C. and it dissolves gold as it rises in temperature to 309° C., at which, as shown in FIG. 5, the tin continues to dissolve gold and successively converts from $AuSn_4$ to $AuSn_2$, and then to AuSn. Further heating to less than 500° C. may cause formation of some ζ (zeta) gold-tin upon cooling, but this has no deleterious effect. In practice, in the presence of gold, tin, silicon and aluminum, temperatures above 410° C. are avoided to avoid deleterious $AuAl_2$, a brittle, purple phase, sometimes called the "purple plague" due to the cracking and shrinkage problems associated with its formation. Upon cooling, the AuSn phase freezes at 280° C., a higher temperature than the initial melting temperature and less shrinkage effects are suffered upon further cooling due to the presence of the less brittle AuSn phase.

The bond obtained from the above process is stronger, more uniform, and more consistent than obtainable from preformed gold-tin alloys. The reasons for this are not fully understood, but it has been observed that electrode material having such successive coatings or layers of gold and tin will initially melt at the melting point of tin, and upon further heating will exhibit unusual agitation in the melt, particularly as the electrode reaches about 309° C. This unusual agitation is attributed primarily to compound changes as the tin dissolves the gold. This agitation improves wetting and promotes uniformity in the bond material.

When the gold layer is sufficient and the tin does not dissolve the entire gold layer, the gold does not dewet the electrode, and upon cooling the gold-tin alloy freezes at 280° C., considerably higher than the initial melting point of the tin, 232° C. This freezing, in the presence of excess gold and at higher temperature, produces an excellent bond with a minimum of freezing stress, and avoids silicon crystal breakage upon cooling. If the tin in the layer is present in excessive proportion, or if the temperature is high enough for the tin to dissolve through the gold layer 23, the gold-tin alloy is likely to dewet the electrode surface since gold-tin does not adequately wet many electrode metals, and particularly molybdenum and tantalum. The proportions of gold and tin preferred are about 3 units of gold to one of tin, by volume. Films 23 and 24 of .001″ and .0003″ have worked well, for bonding in forming gas (85% $N_2$, 15% $H_2$, less than 30° F. dew point). Wetting ability is improved by adding up to about 2% gallium arsenic or silver, or up to 5% indium, to the tin, but the bonding alloy is essentially gold-tin, and predominantly AuSn. Further additions do not materially improve wetting ability. For gold films of about .001″ thickness, a volume ratio of 5/100 tin to gold has been found to be too little tin for good results, and 70/100 is too much tin which forms undesirable, high tin compounds, and subjects the electrode to risk of dewetting, hence poor bonding. A ratio between 1/4 and 1/2 is preferred.

In FIG. 1 the ceramic ring 16 is provided with metallized end surface layers 17 and 18 which have been vacuum sintered, then $H_2$ sintered, to purify the material and make it suitable for semiconductor device manufacture. A preferred metallizing process coats the ceramic end surfaces with a molybdenum manganese mixture and sinters it in a wet $H_2$ atmosphere, then electrolessly plates copper onto the molybdenum-manganese. Nickel may then be plated on the copper, and the plated coatings purified by heating in vacuum, then in an $H_2$ atmosphere. The resulting nickel surface is suitable for subsequent alloy-bonding processes, such as the gold-tin alloy bond disclosed herein.

The tin and gold layers 23, 24 of the base electrode 21 will bond to the metallized end surface of the ring 16 to form a hermetic seal.

The upper, emitter, electrode 31 is preferably of non-magnetic material such as tantalum or molybdenum for indication and handling purposes, and each side thereof is coated with gold and tin layers 32, 33 and 34, 35 corresponding to layers 23, 24. This electrode is thus reversible, and the gold-tin alloy 40, 41 after bonding becomes substantially metallic "white," or silver, in color.

While the bonding of an electrode to a semiconductor crystal is generally more difficult than bonding to other metals the forming of a hermetic seal to a ceramic ring with metallized end portions is quite critical, and the above described gold-tin alloy bonding process is very suitable for such bonds. In FIG. 1, ring 16 is provided with metallized end surfaces 17 and 18 which are assembled in contact with tin layers 35, 24 respectively of the electrodes 31 and 21. The semiconductor crystal 11 is assembled with the aluminum bit 12 in contact with tin layer 35, and the crystal 14 face, or a gold layer thereon, in contact with tin layer 24 of electrode 21. During the heating and cooling cycle of the bonding process as shown in FIG. 3, the tin layers first melt at 232° C., and upon further heating the tin gradually dissolves the gold, forming AuSn at about 309° C. After heating to between 309° C. and about 450° C. (less than 500° C. to retain AuSn) for making a silicon device, the assembly is cooled and the bond freezes at 280° C., leaving an excess of gold from the original gold layers 23 and 34. The gold-tin bonds 41 and 42 are formed between the ring 16 and the electrodes 31 and 21, and gold-tin bonds 43 and 44 are formed between the bit 12 and electrode 31 and between the crystal 14 and electrode 21. Bonds 41 and 43, and bonds 42 and 44, form essentially continuous layers of gold-tin on the respective electrodes 31 and 21.

The bonding process disclosed herein is peculiarly useful in bonding a first element, which is subject to dewetting by AuSn, to a second element which is difficult to wet, particularly by tin. Electrode materials such as molybdenum, tantalum, and the iron-nickel-cobalt alloys whose coefficients of thermal expansion closely match those of silicon, germanium, glasses or III–V compound semiconductors are generally subject to dewetting by AuSn but are easily bonded to gold; and aluminum and silicon are particularly difficult to bond to or to wet with tin. Other semiconductor materials which may be suitably bonded as herein described include the III–V compounds such as indium-antimonide, gallium-arsenide, gallium-phosphide and indium-phosphide.

Figure 4:
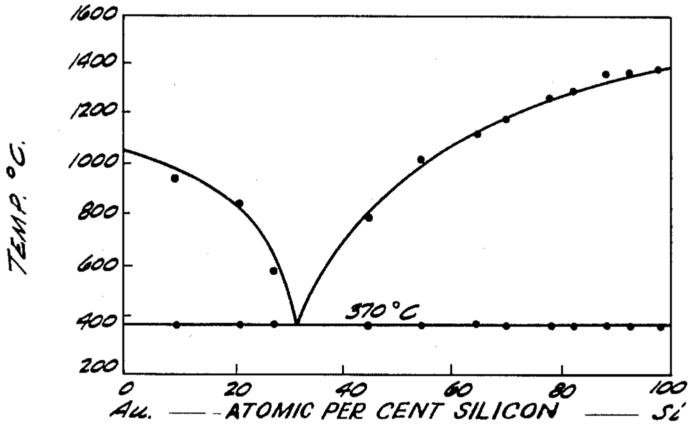
FIG. 4 is a portion of a binary constitution diagram for the system gold-silicon.

While this bonding process has special value in solving certain particular bonding problems such as dewetting of electrodes, wetting of aluminum or silicon, etc., its further usefulness as general bonding process makes possible a variety of semiconductor products which may be bonded and encapsulated in a single step and at temperatures that do not destroy desired crystal properties. In semiconductor manufacture wherein gold wire leads are bonded to silicon, the melting temperature of gold-silicon as shown in FIG. 4 is about 370° C., and the present process is ideally suited for encapsulation at temperatures below 370° C. which will not disturb previously formed device characteristics.

Having disclosed our invention, we claim:

1. The method of bonding silicon semiconductor crystal material to a metallic electrode, which comprises: forming a first layer of gold on a portion of the electrode; forming a second layer of tin on the gold layer having a volume ratio between 5/100 and 70/100 tin to gold; assembling silicon semiconductor material on the tin layer; heating the assembly to at least 309° C. for a time sufficient to form the tin into a predominantly AuSn alloy; and cooling the assembly.

2. The method of bonding a first metallic material to a second metallic material, which comprises: forming a first layer of gold on a portion of the first metallic material; forming a second layer of tin on the gold layer; assembling silicon semiconductor material on the tin layer; heating the assembly to at least 309° C. for a time sufficient to form the tin into a predominantly AuSn alloy, and to a temperature which leaves a portion of the gold layer undissolved by the tin; and cooling the assembly.

3. The method of bonding semiconductor crystal material to a metallic electrode, which comprises: forming a first layer of gold on a portion of the electrode; forming a second layer of tin on the gold layer; assembling semiconductor material on the tin layer; heating the assembly to at least 309° C. for a time sufficient to form the tin into a predominantly AuSn alloy and to a temperature such as to leave a portion of the gold unalloyed on the electrode; and cooling the assembly.

4. The method of bonding a metal which tends to dewet from tin to a second metallic material, which comprises: forming on said metal a first layer of gold and on the gold a second layer of tin in a volume proportion between 5/100 and 70/100 tin to gold; assembling said metal with said metallic material with the second layer in contact therewith; heating the assembly to at least 309° C. for a time sufficient to form the tin into predominantly AuSn alloy; and cooling the assembly.

5. The method of bonding a metal which tends to dewet from tin to a second metallic material, which comprises: forming on said metal a first layer of gold and on the gold a second layer of tin in a volume proportion between ¼ and ½ tin to gold; assembling said metal with said metallic material with the second layer in contact therewith; heating the assembly to at least 309° C. for a time sufficient to form the tin into predominantly AuSn alloy; and cooling the assembly.

6. The method of bonding a metal which tends to dewet from tin to a second metallic material, which comprises: forming on said metal a first layer of gold and on the gold a second layer of tin; assembling said metal with said metallic material with the second layer in contact therewith; heating the assembly to at least 309° C.

for a time sufficient to form the tin into predominantly AuSn alloy and the temperature being such as to leave an excess of gold on said metal; and cooling the assembly.

7. The method of encapsulating semiconductor crystal devices, which comprises: assembling a semiconductor crystal device between first and second electrode elements, each having coated on a surface thereof successive layers of gold and tin; heating the assembly to over 309° C. and for a time to form AuSn but leave undissolved gold on said surface, whereby the AuSn may wet device surfaces; and cooling the assembly to bond the elements to the device.

8. The method of encapsulating semiconductor crystal devices, which comprises: assembling an insulating element in contact with a semiconductor crystal device and with first and second electrode elements, each electrode element having coated on a surface thereof successive layers of gold and tin; heating to a temperature above 309° C. and for a time sufficient to form AuSn but leave some undissolved gold on the surfaces, whereby the AuSn may wet the device and insulating element; and cooling the assembly to bond the electrode elements to the insulating element and to the device.

References Cited in the file of this patent

UNITED STATES PATENTS

| | | |
|---|---|---|
| 2,924,004 | Wehrmann et al. | Feb. 9, 1960 |
| 2,971,251 | Willemse | Feb. 14, 1961 |
| 2,980,983 | Beale et al. | Apr. 25, 1961 |
| 2,983,035 | Oxx | May 9, 1961 |
| 3,044,147 | Armstrong | July 17, 1962 |

OTHER REFERENCES

Hansen: Constitution of Binary Alloys, 2nd ed., McGraw-Hill, 1958, p. 233.